(12) United States Patent
Scott et al.

(10) Patent No.: US 6,727,578 B1
(45) Date of Patent: Apr. 27, 2004

(54) SEMICONDUCTOR DEVICE HAVING POWER SUPPLY VOLTAGE ROUTED THROUGH SUBSTRATE

(75) Inventors: David B. Scott, Plano, TX (US); Heng-Chih Lin, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 361 days.

(21) Appl. No.: 09/392,276

(22) Filed: Sep. 9, 1999

Related U.S. Application Data

(60) Provisional application No. 60/099,963, filed on Sep. 11, 1999.

(51) Int. Cl.[7] .................... H01L 23/52; H01L 23/495
(52) U.S. Cl. ........................... 257/691; 257/670
(58) Field of Search ................ 257/667–677, 257/738, 690–700

(56) References Cited

U.S. PATENT DOCUMENTS

| | | | |
|---|---|---|---|
| 4,738,389 A | 4/1988 | Moshier et al. | |
| 4,751,048 A | 6/1988 | Christodoulou et al. | |
| 4,829,362 A | * 5/1989 | Tran et al. | 357/70 |
| 5,134,039 A | 7/1992 | Alexander et al. | |
| 5,187,021 A | 2/1993 | Vydra et al. | |
| 5,520,752 A | 5/1996 | Lucey, Jr. et al. | |
| 6,172,398 B1 | * 1/2001 | Hshieh | 257/330 |

* cited by examiner

Primary Examiner—Ori Nadav
(74) Attorney, Agent, or Firm—Wade James Brady, III; Frederick J. Telecky, Jr.

(57) ABSTRACT

A semiconductor device (200) having a substrate routed power supply voltage is disclosed. The semiconductor device (200) includes a relatively highly doped substrate (302) and an epitaxial layer (304) formed over the substrate (302). In one embodiment (200), a surrounding conductive structure (202) is formed on the peripheral edges of the semiconductor device (200) die. The surrounding conductive structure (202) is coupled to the substrate (302). In another embodiment, the back side of the die (404) is coupled to the conductive portion (402) of an integrated circuit package. The conductive portion (402) is coupled to a power supply voltage. In another embodiment (700), the surrounding conductive structure (702) is coupled to a power supply voltage by one or more bond pads (710) formed on, or coupled to, the surrounding conductive structure (702).

12 Claims, 3 Drawing Sheets

SEMICONDUCTOR DEVICE HAVING POWER SUPPLY VOLTAGE ROUTED THROUGH SUBSTRATE

This application claims priority under 35 USC §119(e)(1) of U.S. provisional application No. 60/099,963 filed Sep. 11, 1999.

TECHNICAL FIELD

The present invention relates generally to semiconductor integrated circuit devices, and more particularly to power supply circuits for semiconductor integrated circuit devices.

BACKGROUND OF THE INVENTION

The operation of most semiconductor integrated circuit devices relies on the application of a high power supply voltage and low power supply voltage. Such supply voltages allow nodes to be driven according to voltage and current switching actions, and thus provide the desired device functions. In addition, such supply voltages often serve to maintain a reverse bias condition at p-n junctions within the substrate. This allows circuit devices of opposite conductivity types, such as n-channel and p-channel metal (conductor)-oxide(insulator)-semiconductor (MOS) transistors, to be formed within the same semiconductor layer.

Conventionally, an integrated circuit device (sometimes referred to as a "die" or "chip") is formed on and within a portion of a silicon wafer (also referred to as a "slice"). The die is then placed into some sort of package that provides electrical access to the die. Many types of packages will include a "lead frame." A lead frame typically includes a die paddle, which provides a planar surface for physically holding the die, and a number of conductive leads, which carry electrical signals to the die. The die is attached to the die paddle by a die attach material. The leads are then attached to the die by conductive bond wires. Thus, with such an arrangement, the high and low power supply voltages are then applied to the die by connecting selected leads to the power supply voltages. The power supply voltages are then carried to the die by their associated bond wires. Other signals, such as input and output signals, can be carried to and from the die by bond wire/lead combinations.

On the die itself, the bond wires are connected to the die at exposed portions of a conductive layer referred to as "bond pads." In the case of power supply voltage bond pads, the power supply voltages are carried from the associated bond pads to various locations within the die by patterned conductive layers. Because of the dense arrangement of most integrated circuits, the power supply wiring requirements can often result in one conductive layer carrying one power supply voltage, while a second conductive layer carries the other power supply voltage.

It is also noted that the physical area required for bond pads can be considerable. Bond pads are relatively large structures as they must provide sufficient area for a bond wire to make a low resistance ohmic contact with a conductive layer on the die. Any approach to semiconductor device packaging that can reduce the number of bond pads would free up valuable area on the die. Such extra area can provide for more relaxed signal routing and device placement requirements.

Because a low power supply voltage (which is typically zero volts or "ground") is often used to establish a signal value (i.e., ground representing a logic "0" while the high power supply represents a logic "1") it is important to have a low resistance to ground within a semiconductor device. In the event the resistance is too high, the discharge of a large capacitive load through the device (via a lead frame pin, for example) can lead to "ground bounce." Ground bounce results in the ground power supply potential rising above the zero volts level, and thus result in an erroneous signal value. The inherent inductance within the package wiring can also add to ground bounce effects.

High resistance paths to power supply voltages can also result in higher power consumption rates when nodes within a semiconductor device are charged and discharged.

Referring now to FIG. 1, a side cross sectional view of a portion of a prior art integrated circuit is set forth. The portion is designated by the general reference character 100 and illustrates an n-well complementary MOS (CMOS) arrangement. The integrated circuit portion 100 is formed on a relatively highly doped p-type substrate 102. According to well-known techniques, an epitaxial layer of relatively lightly doped p-type silicon 104 is grown over the substrate 102. An n-type well 106 is then formed within the epitaxial layer 104. Isolation structures 108 are formed within the epitaxial layer 104 and n-well 106, and thereby define "active areas" in the surface of the semiconductor device. Circuit devices, such as transistors or the like, can then be formed in the active areas. The isolation structures 108 may be formed from a variety of isolation techniques, including the local oxidation of silicon (LOCOS) or silicon trench isolation (STI). Active areas within the epitaxial layer 104 include relatively highly doped p-type regions 110 and n-type regions 112. Similarly, the n-well 106 active areas also include relatively highly doped n-type regions 114 and p-type regions 116.

In a CMOS device, the p-type epitaxial layer 104 will be biased to a low power supply voltage. This is conventionally accomplished by coupling the epitaxial layer 104 to the low power supply voltage by way of a contact, such as the highly doped p-type region 110. Similarly, in order to maintain the n-well 106 at a reverse biased state with respect to the epitaxial layer 104, the n-well 106 will be biased to a high power supply voltage. Conventionally, this is accomplished by coupling the n-well 106 to a high power supply voltage by way of a contact, such as the highly doped n-type region 114. It is these types of biasing requirements that can result in dense power supply wiring requirements.

As noted above, the power supply wiring requirement can result in larger device sizes, due to the number of power supply contacts required. In addition, the need for low resistance paths to power supplies (to avoid ground bounce and reduce power consumption) and dense wiring constraints, can force multiple wiring layers, adding to the complexity and/or cost of the semiconductor device.

In light of the above drawbacks in existing power supply circuits, it would be desirable to have a power supply circuit arrangement that provides for a more compact and/or less complex semiconductor device.

Another aspect of semiconductor device packaging and operation arises out of the increasingly higher operating speed of such devices. In a conventional packaging arrangement, a bond wire carries the low power supply voltage to a conductive layer on the semiconductor device. Other signals, that vary in potential with respect to the low power supply level, are carried to the device by other bond wires. At lower frequencies (operating speeds) conventional packaging arrangements may provide sufficient performance. However, at higher frequencies transmission line effects can come into play, and it may be desirable to have specialized packaging that addresses such effects. Such "transmission line" wiring approaches often rely on the presence of a "ground" plane, such as a planar conductor coupled to the ground voltage. Unfortunately, conventional packaging arrangements are not conducive to such specialized wiring approaches, and do not provide a ground plane.

It would be desirable to provide an integrated circuit semiconductor device packaging arrangement that is conducive to transmission line-type wiring approaches.

Yet another aspect of semiconductor integrated circuits is that of signal routing. In more complex semiconductor devices, complex conductive layer wiring is often required. Such wiring is necessary, not only to ensure that circuit portions are properly connected, but that such connections have sufficiently low resistance and capacitance. Such wiring requirements often give rise to semiconductor devices with two or more metallization layers. Such additional conductive layers can add to the complexity and expense of the manufacturing process. In addition, such additional conductive layers can introduce a higher number of failing devices (reduce "yield").

Any approach to semiconductor devices that can reduce the complexity of the device wiring scheme can greatly benefit the device, as it can reduce the complexity of the device, and thereby provide greater leeway in placing and routing circuits. In addition, improvements in wiring approaches that eliminate a conductive layer can increase the yield in the device, as there is one less layer that can introduce defects.

SUMMARY OF THE INVENTION

According to the disclosed embodiments, a semiconductor device is formed on a highly doped substrate. The highly doped substrate serves to route a power supply voltage to the semiconductor device, thereby reducing the power supply routing requirements of conductive layers on the top of the semiconductor device.

According to one aspect of the disclosed embodiments, the highly doped substrate can be connected to the power supply voltage by a conductive die attach material.

According to another aspect of the disclosed embodiments, the semiconductor device includes a peripheral conductive layer that is coupled to the highly doped substrate. The peripheral conductive layer is also coupled to a power supply voltage by a number of bond wires.

An advantage of the disclosed embodiments is that it provides a semiconductor device that is more conducive to packages that include transmission line-type connections to the die.

DETAILED DESCRIPTION OF THE EMBODIMENTS

The various embodiments set forth herein describe an integrated circuit semiconductor device that is formed on a highly doped substrate. The substrate is coupled to a power supply voltage, and thereby provides power supply routing to various portions of the semiconductor device through the backside of the device. The use of the substrate for power supply voltage routing reduces the amount of conductive layer wiring required, can eliminate the need for selected bond pads, and is conducive to packaging that includes "transmission line" type connections to the semiconductor device.

Figure 1:
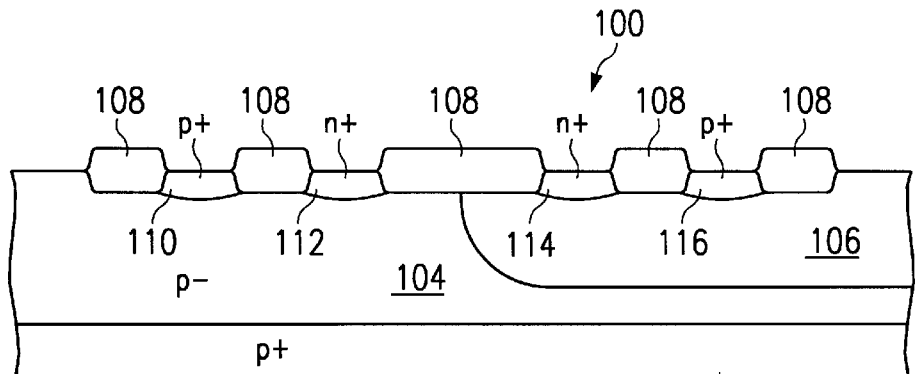
FIG. 1 is a side cross sectional view of a portion of an n-well complementary metal(conductor)-oxide(insulator)-semiconductor (CMOS) semiconductor device.

Referring now to FIG. 1, advances in semiconductor device manufacturing that allow the substrate to route power supply voltages will be described. For prior art larger geometry semiconductor devices, routing the power supply voltages through the substrate 102 is not feasible, as the resistance presented by the epitaxial layer 104 is prohibitively high. This is best demonstrated by a sample resistance calculation. For the sample calculation, it will be assumed that the semiconductor device is manufactured with one micron (1 $\mu$m) technology (technology that creates transistors with gate lengths of about 1 $\mu$m), and has a p-type epitaxial layer 104 with a resistivity ($\rho$) of about 2 $\Omega$-cm. The thickness (L) of the epitaxial layer assumed to be about 10 $\mu$m. Thus, the resistance (R) of a 10 $\mu$m×10 $\mu$m area (A) is given by the equation below.

$$R=\rho(L/A)=2\ \Omega\text{-cm}[(10^{-3}\text{ cm})/(10^{-3}\text{ cm}\times 10^{-3}\text{ cm})]=2\ k\Omega.$$

Such a high resistance value is undesirable, as it would contribute significantly to adverse effects such as ground bounce and power consumption.

However, for scaled technology (advances in manufacturing that allow feature sizes to be fabricated at a reduced scale with respect to previous technologies) the resistance of the epitaxial layer is decreased, making it feasible to use the epitaxial layer as power supply routing structures. A sample calculation will be set forth to illustrate this point. It will be assumed that the semiconductor device is fabricated with 0.2 $\mu$m technology, and the epitaxial layer therefore has a thickness of about 1 $\mu$m. In addition, the isolation and design requirements of the scaled technology results in the scaled epitaxial layer having a lower resistivity ($\rho$), assumed to be 0.2 $\Omega$-cm in this particular example. Accordingly, for the same 10 $\mu$m×10 $\mu$m area, the resistance is given as follows.

$$R=\rho(L/A)=0.2\ \Omega\text{-cm}[(10^{-4}\text{ cm})/(10^{-3}\text{ cm}\times 10^{-3}\text{ cm})]=20\ \Omega.$$

This lower resistance value makes it feasible to utilize the substrate to route a power supply voltage.

Figure 2:
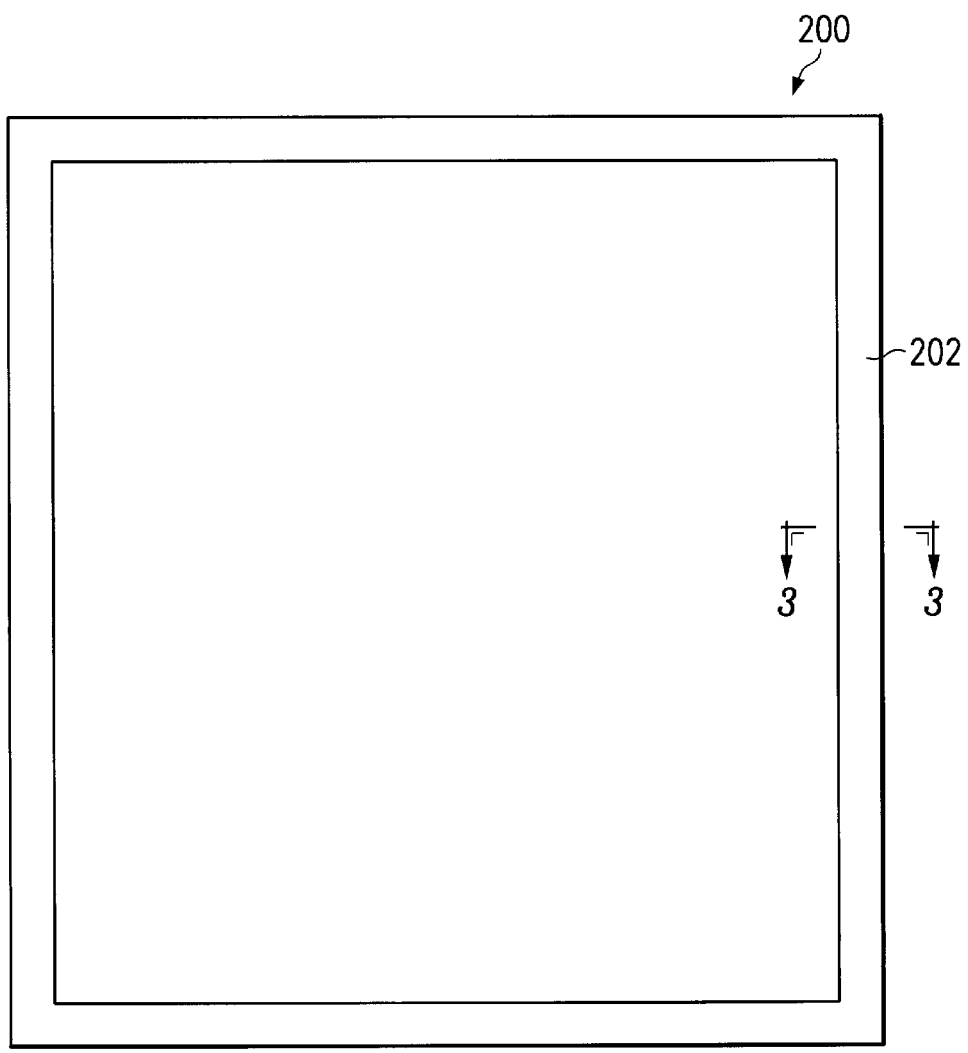
FIG. 2 is a top plan view of a semiconductor device die according to a first embodiment.

Referring now to FIG. 2, a semiconductor device die according to a first embodiment is set forth in a simplified top plan view. The first embodiment is designated by the general reference character 200 and is formed on a semiconductor substrate. The various features that make up the majority of the integrated circuit device structures (e.g., active areas, isolation regions, conductive layers, and contacts) are omitted to more clearly illustrate a surrounding peripheral conductive structure 202. In the first embodiment 200, the peripheral conductive structure 202 is a metallization layer that surrounds the entire edge of the die, and makes contact with the epitaxial layer, and hence the semiconductor substrate. In this way, the power supply voltage is carried on the substrate, as well as on the surrounding conductive structure 202.

By allowing access to the power supply voltage by way of the substrate, the amount of wiring required is greatly reduced. For example, certain wiring arrangements may require higher level metallization layers in order to create conductive "overpasses" to cross over lines that carry a power supply voltage. The need for such overpasses can be reduced or eliminated by providing the power supply voltage through the bottom of the device, rather than by a wiring layer on the top of the device.

Figure 3:
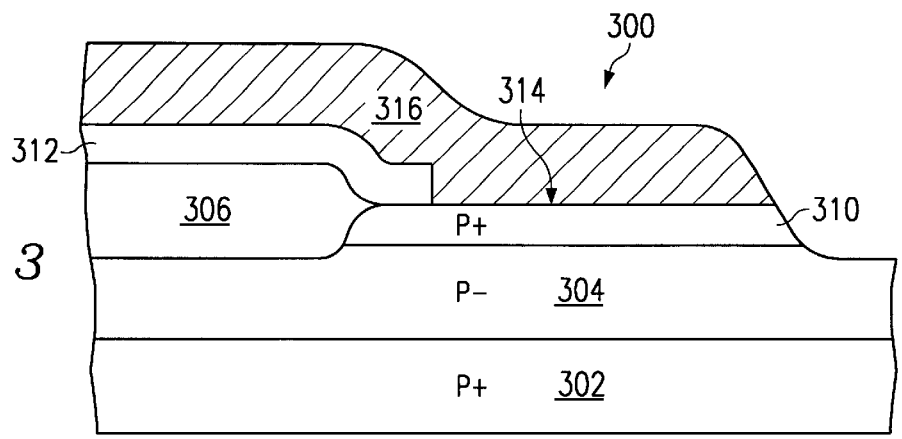
FIG. 3 is a side cross sectional view illustrating the die edge of the first embodiment set forth in FIG. 2.

A portion of the surrounding conductive structure 202, shown by the line 3—3 in FIG. 3, is shown in a side cross sectional view in FIG. 3. Referring now to FIG. 3, the semiconductor device is shown to be formed on a highly doped p-type substrate 302. The highly doped p-type substrate can be formed in an initial starting semiconductor wafer, such as a silicon wafer. A relatively lightly doped p-type epitaxial layer 304 is formed over the substrate 302. The epitaxial layer 304 may be formed according to well-known epitaxial reactor manufacturing equipment. An isolation structure 306 is also set forth in FIG. 3, and is shown to be formed in the epitaxial layer 304. The isolation structure 306 can be used to electrically isolate active areas within the epitaxial layer 304, and may be formed using local oxidation of silicon (LOCOS) or silicon trench isolation (STI) techniques. Also formed within the epitaxial layer 304 is a highly doped p-type contact region 310. The contact region 310 may be formed using ion implantation techniques.

An oxide layer 312 is deposited over the isolation structure 306 and exposed portions of the epitaxial layer 304. The insulator layer 312 can serve to isolate subsequently deposited conductive layers from previously deposited conductive layers. As just one example, at another location on the semiconductor device (not shown in FIG. 3) MOS transistors can be formed which include gates formed from doped polysilicon, or a polysilicon-silicide combination. The insulator layer 312 can be doped or undoped silicon dioxide ("oxide") that insulates the gate layer from a subsequent metallization layer.

A contact opening 314 is etched through the insulator layer 312 to expose the contact region 310. A conductive layer 316 is deposited over the insulator layer 312 and makes ohmic contact with the contact region 310 by way of the contact opening 314. In the particular arrangement of FIG. 3, an etch step is applied, which etches the edge of the conductive layer 316 and continues through the contact region 310 to the epitaxial layer. The conductive layer 316 may be a metallization layer formed from aluminum, titanium-tungsten, or other commonly used metallization layers. The conductive layer 316 is patterned to create the surrounding conductive structure shown as item 202 in FIG. 2.

The arrangement set forth in FIG. 3 can be advantageously implemented in existing semiconductor device layouts as it can be used to establish a die "seal." A die seal is a structure formed on the peripheral edges of the die that serves to prevent lifting of deposited layers and/or prevent contaminants (such as mobile ions) from propagating from the outside of the die to the internal portions of the die, and thereby affect the operation of the semiconductor device.

An estimation of the resistance of the resulting peripheral conductive structure can be calculated. If it is assumed that contact diffusion region is 50 $\mu$m wide and the die has dimensions of 1 centimeter (1 cm) by 1 cm, the resistance presented from the conductive layer to the epitaxial region (which has a 0.2 $\Omega$-cm resistivity) can be generally approximated by the equation below.

$R=\rho(L/A)$ $=\rho[$(epitaxial layer thickness)/(perimeter of die)(width of peripheral structure)$]=$ $=0.2$ $\Omega$-cm$[(10^{-4}$ cm$)/(4$ cm$)(50\times10^{-4}$ cm$)]$ $=0.001$ $\Omega$.

The entire resistance to the routed power supply voltage would also include the substrate. Thus, given a substrate resistivity ($\rho$) of 0.01 $\Omega$-cm, and a substrate thickness of 0.1 cm, the resistance presented by the substrate can also be generally approximated by the below equation.

$R=\rho(L/A)$ $=\rho[$(substrate thickness)/(perimeter of die)(width of peripheral structure)$]=$ $0.01$ $\Omega$-cm$[(10^{-1}$ cm$)/(4$ cm$)(50\times10^{-4}$ cm$)]$ $=0.05$ $\Omega$.

In this manner, provided sufficient highly doped contact area is provided (such as contact region 310 in FIG. 3), a relatively low resistance is presented when a power supply is routed through the substrate. It is noted that the particular example of FIG. 3 is an n-well CMOS device, resulting in a p-doped substrate. Thus, a low power supply (for example, "ground") can be routed through the substrate.

Figure 4:
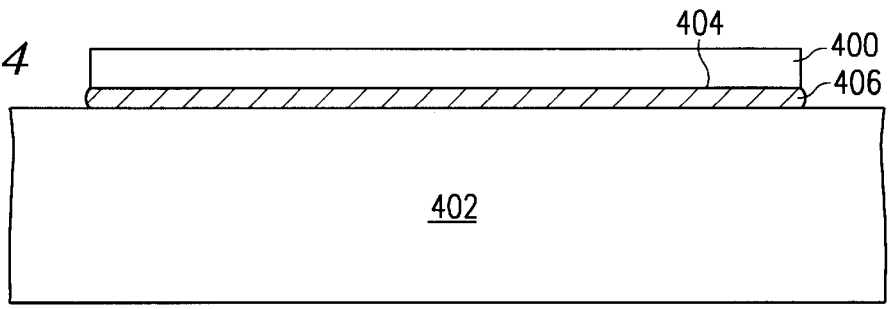
FIG. 4 is side cross sectional view of a semiconductor device and a portion of its associated package according to one embodiment.

Referring now to FIG. 4, a semiconductor device and a portion of a semiconductor device package is set forth in a side cross sectional view. The semiconductor device is shown in die form and represented by the reference character 400. The die 400 is attached to a conductive package portion 402. The conductive package portion 402 may be, as just one example, a die paddle portion of a conductive lead frame. This presents just one possible package example, and so should not be construed as limiting the invention. The conductive package portion 402 is coupled to a power supply voltage. The power supply voltage is coupled from the conductive package portion 402 to the back side 404 of the die 400 by a conductive die attach material 406. As just one example, the power supply voltage could be ground (0 volt), resulting in the conductive die attach material 406 coupling the ground voltage to the p-doped substrate of the die 400. The conductive die attach material 406 can be a conductive epoxy or the like. In this manner, the ground power supply voltage can be provided to the die 400 without the use of bond pads. This can reduce the complexity of the packaging, and even improve reliability by reducing the possibility of faulty ground bond wire connections. In addition, by eliminating the need for a power supply bond wire, additional area for other bond wires or other circuitry will result.

The routing of a power supply voltage according to the disclosed embodiments can lead to more reliable high frequency performance. If reference is made to FIG. 4, as just one example, assuming that the ground power supply voltage is routed by the substrate, the resulting structure provides a conductive plane at the ground voltage that functions as a ground plane for the entire device. Such a structure is particularly suited for packages having die connections that take transmission line effects into consideration. Such structures can include, without limitation, two wire-, strip line-, slab line-, and coaxial line-type structures.

Figure 5:
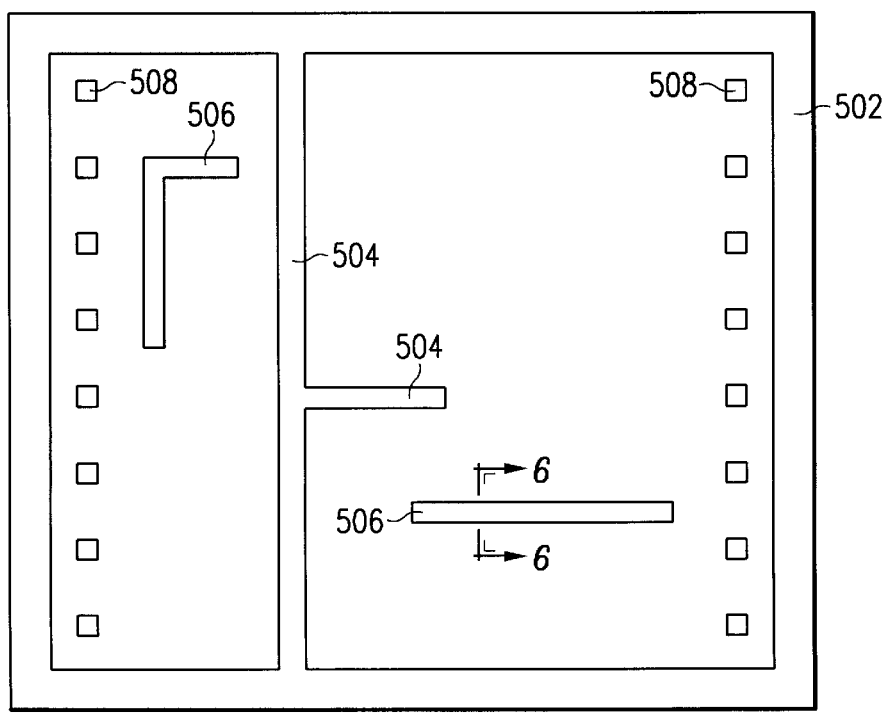
FIG. 5 is a top plan view of a semiconductor device die according to a second embodiment.

Referring now to FIG. 5, a top plan view is set forth illustrating a second embodiment. The second embodiment is designated by the general reference character 500, and is intended to generally illustrate how a substrate routed power supply voltage can be supplied to various locations internal to the semiconductor device. The second embodiment 500 includes a surrounding conductive structure 502. The surrounding conductive structure 502 is in ohmic contact with the substrate, and can have a structure, as one example, such as that set forth in FIG. 3.

The second embodiment 500 includes a power supply bussing network that includes conductive layer routed portions 504 and substrate routed portions 506. The conductive layer routed portions 504 provide the power supply voltage to various portions of the semiconductor device 500 by conductive wiring that is connected to the surrounding conductive structure 502. The conductive layer routed portions 504 may be integrally formed with the surrounding conductive structure 502 by being formed at the same time and from the same conductive layer as the surrounding conductive structure 502. For example, a metallization layer may be deposited during the fabrication of the semiconductor device 500 and patterned to form the conductive layer routed portions 504 and the surrounding conductive structure 502. Alternatively, all, or a portion of the conductive layer routed portions 504 may be formed from a different conductive layer than the surrounding conductive structure 502. In such a case the conductive layer routed portions 504 would be coupled to the surrounding conductive structure 502 by way of contact structures, such as "vias" or the like.

The substrate routed portions 506 are formed from a conductive layer and are isolated from the surrounding conductive structure 502. Thus, instead of receiving the power supply voltage from the surrounding conductive structure 502, like conductive layer routed portions 504, the substrate routed portions 506 are coupled directly to the substrate. This arrangement allows for greater flexibility in the placement of other conductive lines (wiring not associated with carrying the power supply voltage) as conductive lines do not have to be run from a common power supply bus line coupled to a power supply bond pad. Like the conductive layer routed portions 504, the substrate routed portions 506 can be formed from the same conductive layer as the surrounding conductive structure 502, or alternatively, can be formed form a different conductive layer.

Figure 6:
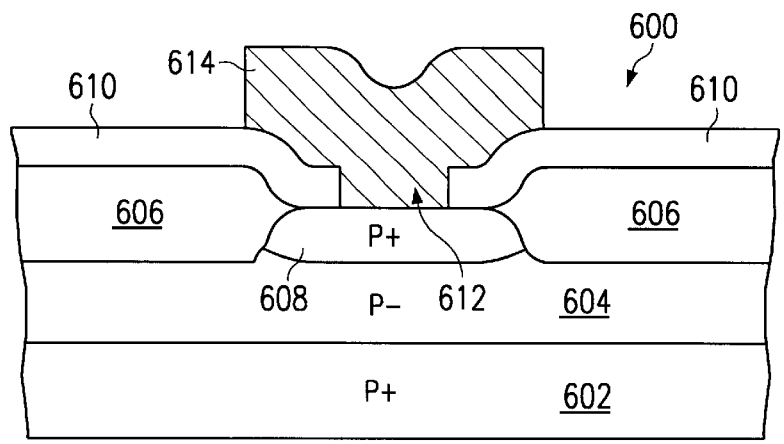
FIG. 6 is a side cross sectional view of a power supply connection according to the second embodiment.

Also set forth in FIG. 5 are a number of bond pads, two of which are shown as item 508. The bond pads 508 are shown on opposing sides of the die 500. The bond pads 508 may be formed from the same layer as the surrounding conductive layer 502, or be formed from a different conductive layer. As noted above, in the second embodiment 500, the routing of the power supply voltage through the backside of the die to the substrate, eliminates the need for bond pads that receive such a power supply voltage. A portion of a substrate routed portion 506, shown by the line 6—6 in FIG. 5, is set forth in a side cross sectional view in FIG. 6. The portion of the substrate routed portion 506 is designated by the general reference character 600, and is shown to include a highly doped p-type substrate 602. It is the substrate 602 that is connected to a power supply voltage, and thereby serves to route the power supply voltage. A relatively lightly doped p-type epitaxial layer 604 is formed over the substrate 602. Isolation structures 606 are formed in the epitaxial layer 604. A highly doped p-type contact area 608 is formed between the isolation structures 606. An insulating layer 610 is formed over the insulating structures 606 and the contact area 608. A contact hole 612 is formed in the insulating layer 610 in order to provide access to the contact area 608. A conductive layer is deposited over the insulating layer 610 and makes ohmic contact with the contact area 608. The conductive layer is then patterned to form the substrate routed portion 614. The resulting structure includes a substrate routed portion 614 that makes ohmic contact with the contact area 608. A conductive path between the contact area 608 and the substrate 602 is provided by the epitaxial layer 604. In this manner, a power supply voltage can be applied to the backside of a semiconductor device, and then routed from the substrate to the top side of a semiconductor. In the particular arrangement of FIG. 6, the routed power supply voltage is a low power supply voltage.

Figure 7:
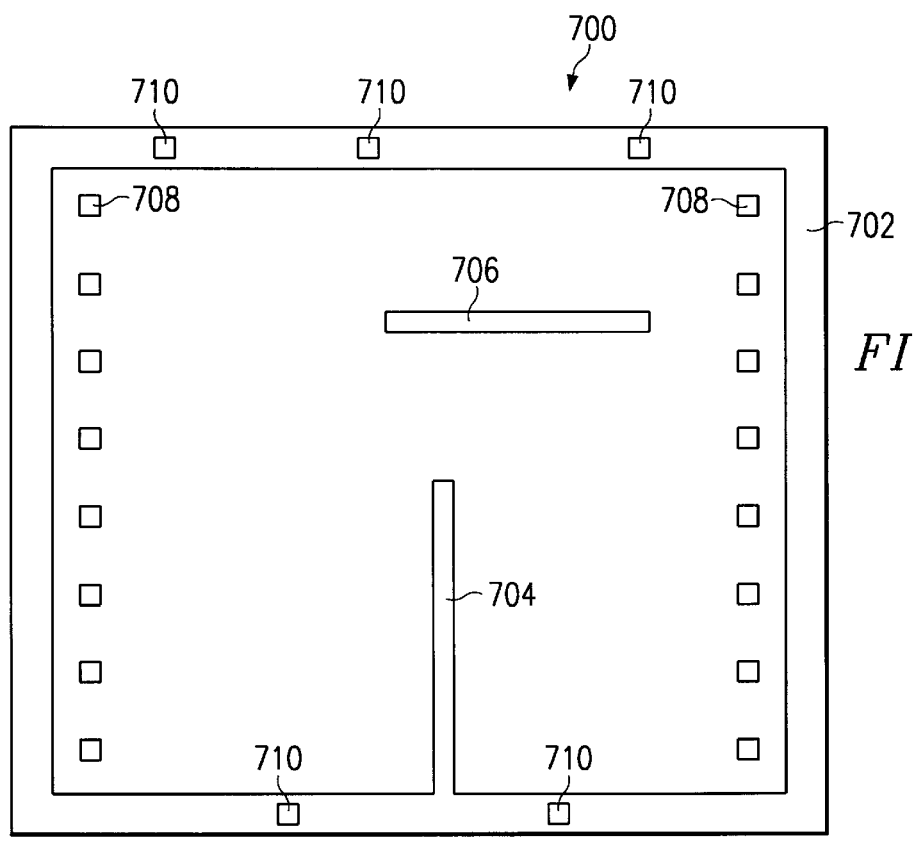
FIG. 7 is a top plan view of a third embodiment.

Referring now to FIG. 7, a top plan view is set forth illustrating a third embodiment. The third embodiment is designated by the general reference character 700, and is intended to generally illustrate an alternate structure for routing the power supply voltage by way of a substrate. The third embodiment 700 can be used in the event a conductive die attach arrangement is not possible or desirable. The third embodiment 700 is shown to include a surrounding, conductive structure 702. The surrounding conductive structure 702, as in the case of the conductive structure 502 of FIG. 5, is in ohmic contact with the substrate. The conductive structure 702 of can have a structure, as just possible one example, such as that set forth in FIG. 3.

Like the second embodiment 500, the third embodiment 700 includes a power supply including both conductive layer routed portions 704 and substrate routed portions 706. These portions (704 and 706) may be formed from the same conductive layer as the surrounding conductive structure 702, or from a different conductive layer. The substrate routed portions 706 can have a structure, as just possible one example, such as that set forth in FIG. 6.

Two types of bond pads are also set forth in FIG. 7. Conventional bond pads, two of which are shown as item 708, are situated within the edges of the die. The conventional bond pads 708 provide a landing place for conductive package connections (such as bond wires, as just one example), that carry signals other than the power supply voltage that is routed through the substrate. In addition to the conventional bond pads 708, the third embodiment 700 also includes power supply bond pads 710. The power supply bond pads 710 are coupled to the surrounding conductive structure 702. The power supply bond pads 710 may be formed by etching windows into insulating layers formed over the surrounding conductive structure 702, or may be formed from a conductive layer different than that of the surrounding conductive structure 702. In the latter case, the power supply bond pads 710 would be coupled to the surrounding conductive structure 702 by contact-like structures, such as vias or the like.

Thus, unlike the second embodiment 500 which receives a power supply voltage from the back side of the die by a portion of the package and a conductive die attach, the third embodiment 700 receives a power supply voltage by one or more conductive package connections (such as bond wires). The power supply is then coupled to the substrate by the surrounding conductive structure 702. The power supply voltage is then routed to semiconductor device by the substrate.

Figure 8:
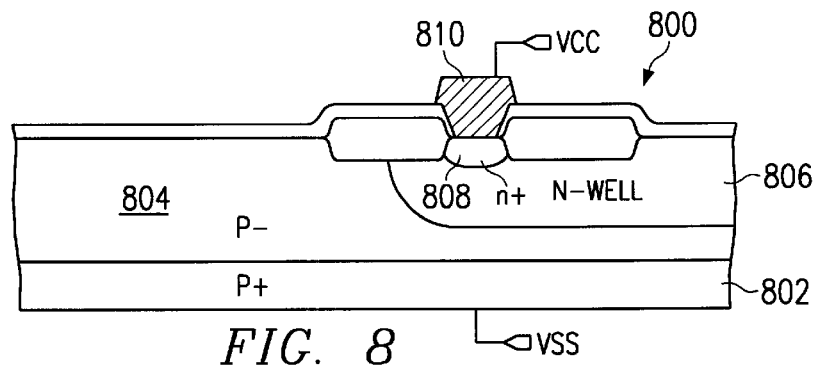
FIG. 8 is a side cross sectional view of a CMOS device illustrating a power supply arrangement according to one embodiment.

Referring now to FIG. 8, a sample of an n-well CMOS device utilizing the substrate power supply arrangement is set forth. The CMOS device is set forth in side cross sectional view and designated by the general reference character 800. A highly doped p-type substrate 802 is coupled to a low power supply voltage VSS. This connection may be made by way of the backside of the device (like the backside die attach set forth in FIG. 4), or alternatively, may be made by bond pads and a conductive structure coupled to the substrate, such as that set forth in FIG. 7. A relatively lightly doped p-type epitaxial layer 804 is formed over the substrate 802 and includes an n-type well 806 formed within. As in a conventional n-well CMOS arrangement, the n-well 806 is coupled to a high power supply voltage (VCC) by a highly doped contact region 808. The contact region is coupled to a conductive layer 810, which is coupled to the VCC voltage. Unlike a conventional n-well CMOS arrangement, in the portions of the device illustrated, there are no highly doped regions in the epitaxial layer 804 that are used for coupling the VSS voltage to the epitaxial layer. This allows the area that would required for VSS contacts to the epitaxial layer to be used for other purposes. Accordingly, when utilized in a CMOS type structure the substrate can be used to route one power supply voltage, while the opposing power supply voltage can be supplied by conventional conductive layer routing. Of course the example set forth in FIG. 8 is but one possible example of arrangement that benefits from the present invention, and should not be construed as limiting the invention to such an arrangement.

Accordingly, it is understood that the various embodiments set forth herein represent but particular variations of the preferred embodiments. Thus, while the present invention has been described in detail, it should be understood that various changes, substitutions, and alterations could be made without departing from the spirit and scope of the invention as defined by the appended claims.

What is claimed is:

1. In a semiconductor device that receives power from a first power supply voltage source and a second power supply voltage source different from said first power supply voltage source, a power supply arrangement, comprising:

a semiconductor die having a top side and an opposing back side, the die including
  a semiconductor substrate relatively heavily doped with impurities of a first conductivity type and providing the back side of the semiconductor die, and
  a first semiconductor layer disposed over the substrate relatively more lightly doped than said semiconductor substrate with impurities of the first conductivity type;
said first power supply voltage conductor coupled to the back side of the die and to said first power supply voltage source for utilization within said die.

2. The power supply arrangement of claim 1, wherein:
the first semiconductor layer has a resistivity that is less than or equal to 0.2 ohm-centimeters.
3. The power supply arrangement of claim 1, wherein:
the first conductivity type is p-type.
4. The power supply arrangement of claim 1, wherein:
the substrate is formed from doped monocrystalline silicon.
5. The power supply arrangement of claim 1, wherein:
the first semiconductor layer is epitaxial grown doped monocrystalline silicon.
6. The power supply arrangement of claim 1, wherein:
the first power supply conductor is a flat, metal structure.
7. The power supply arrangement of claim 1, wherein the first power supply conductor is a die paddle in a lead frame structure.
8. The power supply arrangement of claim 1, wherein:
the first power supply conductor is coupled to the back side of the die by a conductive die attach material.
9. A semiconductor device power supply routing structure, comprising:
a semiconductor substrate of a first conductivity type and a first impurity concentration having an exposed bottom surface;
a semiconductor layer disposed over the semiconductor substrate, the semiconductor layer being of the first conductivity type and having a second impurity concentration that is less than the first impurity concentration, the semiconductor layer including at least one well of opposite conductivity type having a top surface remote from said bottom surface;
a first power supply conductor for providing a first voltage to said substrate connected to said bottom surface; and
a second power supply conductor coupled to the well at said top surface for providing a second voltage different from said voltage to said substrate at said top surface.
10. The power supply routing structure of claim 9, wherein:
the semiconductor substrate and semiconductor layer include silicon doped with p-type impurities, and the well includes silicon doped with n-type impurities.
11. The power supply routing structure of claim 9, further including:
at least one conductive layer routed portion formed from a conductive layer deposited over the substrate, the conductive layer routed portion being coupled to the first power supply conductor by way of the substrate.
12. The power supply routing structure of claim 11, wherein:
the at least one conductive layer routed portion is formed from the same conductive layer as the first power supply conductor.

* * * * *